United States Patent [19]
Okada et al.

[11] Patent Number: 5,859,556
[45] Date of Patent: Jan. 12, 1999

[54] VARIABLE GAIN SEMICONDUCTOR CIRCUIT

[75] Inventors: Toru Okada; Hideo Abe, both of Kawasaki, Japan

[73] Assignee: Fujitsu Limited, Kawasaki, Japan

[21] Appl. No.: 808,806

[22] Filed: Feb. 28, 1997

[30] Foreign Application Priority Data

Oct. 8, 1996 [JP] Japan ..................................... 8-267211

[51] Int. Cl.⁶ ............................... H03K 5/08; G06G 7/12
[52] U.S. Cl. .......................... 327/328; 327/306; 327/334; 327/560
[58] Field of Search ..................................... 327/308, 560, 327/561, 310, 306, 562, 563, 313, 315, 318, 327, 430, 334, 328; 330/284, 133, 134, 145, 279

[56] References Cited

U.S. PATENT DOCUMENTS

| 5,023,569 | 6/1991 | Raven | 330/285 |
| 5,160,898 | 11/1992 | Black | 330/284 |
| 5,430,335 | 7/1995 | Tanoi | 327/170 |

Primary Examiner—Timothy P. Callahan
Assistant Examiner—Hai L. Nguyen
Attorney, Agent, or Firm—Nikaido, Marmelstein, Murray & Oram LLP

[57] ABSTRACT

Disclosed is a variable gain semiconductor circuit enjoying a low insertion loss, good distortion characteristic, and large variable gain range. The variable gain semiconductor circuit comprises: a first kind of variable gain circuit that inputs an input signal and changes a gain on the basis of a first control signal; a second kind of variable gain circuit, installed in a stage succeeding the first kind of variable gain circuit, for changing a gain on the basis of a second control signal; and a control signal producing unit for producing the first and second control signals using an attenuation value control signal. When the attenuation value control signal falls within one of two variation ranges instructing a large gain, the control signal producing unit produces the first and second control signals so that the first kind of variable gain circuit decreases a gain according to the variation of the attenuation value control signal, and the second kind of variable gain circuit produces a constant gain. When the attenuation value control signal falls within the other variation range instructing a small gain, the control signal producing unit produces the first and second control signals so that a decrease in gain produced by the first kind of variable gain circuit is saturated and the gain remains unchanged, and a gain produced by the second kind of variable gain circuit decreases according to the variation of the attenuation value control signal.

2 Claims, 4 Drawing Sheets

VARIABLE GAIN SEMICONDUCTOR CIRCUIT

BACKGROUND OF THE INVENTION

1. Field of the Invention

The present invention relates to a variable gain semiconductor circuit that is a variable gain circuit employed in a variable gain amplifier such as an automatic gain control (AGC) circuit or the like and realized with a semiconductor circuit. More particularly, this invention is concerned with a variable gain semiconductor attenuator whose distortion characteristic deteriorates very little, whose insertion loss is limited, and whose maximum attenuation is large.

In a receiving apparatus for radio communications or the like, a radio-frequency received signal is amplified by an amplifier, and then mixed with an oscillating signal, of a certain frequency, output from a local oscillator in order to produce an intermediate-frequency signal. For mixture, the received signal is required to have a constant amplitude. The amplitude of the received signal varies markedly depending on a receiving situation. The amplification factor of the amplifier is controlled by feeding back an output signal of a mixer so that a signal with a constant amplitude can always be output from the amplifier. This function is referred to as automatic gain control (AGC). For realizing the AGC function, the amplifier must have a variable gain capability for varying a gain. The present invention relates to a circuit for realizing the variable gain capability for varying the gain of a radio-frequency amplifier.

An example to be described below is a circuit employed in a receiving apparatus for radio communications or the like. In the example, an MES field-effect transistor (MESFET) is used as a semiconductor device. However, the present invention is not limited to this type of transistor. A MOSFET or the like can also be used.

2. Description of the Related Art

The performance of a circuit with a variable gain capability is required to provide a large variable gain range, a small insertion loss, a good distortion characteristic, and easiness in using the capability of the circuit. Amplification circuits whose amplification factors are variable all operate as circuits capable of varying their gain. Various circuits are used as circuits capable of varying gain. In general, a circuit referred to as an attenuator type is widely adopted. In the attenuator type circuit, an FET is connected between an input signal line and ground via a capacitive element and resistor. A control signal is applied to the gate of the FET. However, if this kind of attenuator type circuit is designed so that the quantity of attenuation dependent greatly on the properties of the transistor employed becomes large, the insertion loss of the circuit increases. In other words, the variable gain range and insertion loss have a trade-off relationship. This poses a problem that there is difficulty in greatly increasing the quantity of attenuation.

Another circuit capable of varying a gain includes a type of variable gain circuit that changes a quantity of attenuation, that is, a gain by varying the drain voltage of an FET operating as an amplifier, or a type of variable gain circuit that changes a gain by varying the gate voltage of an FET operating as an amplifier. In the type of variable gain circuit for varying the drain voltage, a control signal used to control the on or off state of the amplifier is usually output from a CMOS LSI needing a low current consumption. However, since an output signal of the CMOS LSI has poor driving ability, the control signal cannot be input directly to the drain of the FET. This type of variable gain circuit must therefore adopt such a method that a switch having a large current capacity is inserted between a power supply and the drain of the FET, and controlled using the control signal in order to change the quantity of attenuation. This poses a problem that the circuit becomes complex. In the type of variable gain circuit for varying the gate voltage of the FET, for increasing the quantity of attenuation, it is necessary to set a gate bias of the FET so that the operating point of the FET becomes as close to a pinch-off point thereof as possible. This poses a problem that the distortion characteristic of the circuit deteriorates. An actual circuit is realized by connecting pluralities of these types of circuits in series or connecting another circuits in series, but it still has the above problems. Even a combination of these types of circuits suffers from the same problems.

SUMMARY OF THE INVENTION

An object of the present invention is to realize a variable gain semiconductor circuit enjoying a large variable gain range, a small insertion loss, and a good distortion characteristic.

A variable gain semiconductor circuit of the present invention is such that: two kinds of variable gain circuits are combined; for one of two variable gain ranges, a gain produced by one variable gain circuit changes but a gain produced by the other variable gain circuit does not change; for the other variable gain range, the gain produced by one variable gain circuit is saturated and does not change but the gain produced by the other variable gain circuit changes. A control unit is included so that the two kinds of variable gain circuits can operate in this way.

To be more specific, an attenuator type circuit is used as a first variable gain circuit, and a type of variable gain circuit in which a gain is changed by varying the gate voltage of an FET operating as an amplifier is used as a second variable gain circuit. These variable gain circuits are combined. When a gain is too large, the first variable gain circuit performs attenuation and a gain produced by the second variable gain circuit remains constant or unchanged. When a gain is too small, the gain produced by the first variable gain circuit is saturated and the gain produced by the second variable gain circuit is changed.

As mentioned above, the attenuator type circuit has a problem in that there is difficulty in increasing the quantity of attenuation because of the insertion loss. The type of variable gain circuit that changes gain by varying the gate voltage of an FET operating as an amplifier has a problem in that there is difficulty in increasing the quantity of attenuation because of the distortion characteristic, and that the distortion characteristic deteriorates when an input signal has a large amplitude. The quantity of attenuation produced by the first attenuator type variable gain circuit is not increased very much but the first and second variable gain circuits are combined to produce a large quantity of attenuation. The insertion loss will therefore not increase. As for the distortion characteristic, deterioration of the distortion characteristic of the second variable gain circuit becomes a problem when the quantity of attenuation produced by the second variable gain circuit is large and the amplitude of an input signal to the second variable gain circuit is large. After the first variable gain circuit whose distortion characteristic does not deteriorate and which is installed in the preceding stage of the second variable gain circuit carries out attenuation, the second variable gain circuit performs attenuation. The quantity of attenuation to be produced by the second variable gain circuit is therefore small. Besides, the amplitude of the input signal becomes smaller when it is fed to the second variable gain circuit. Deterioration of the distortion characteristic of the second variable gain is therefore minimized.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Before proceeding to a detailed description of the preferred embodiment of the present invention, a prior art gain controllable amplifier will be described with reference to the accompanying drawings relating thereto for a clearer understanding of the differences between the prior art and the present invention.

Figure 1:
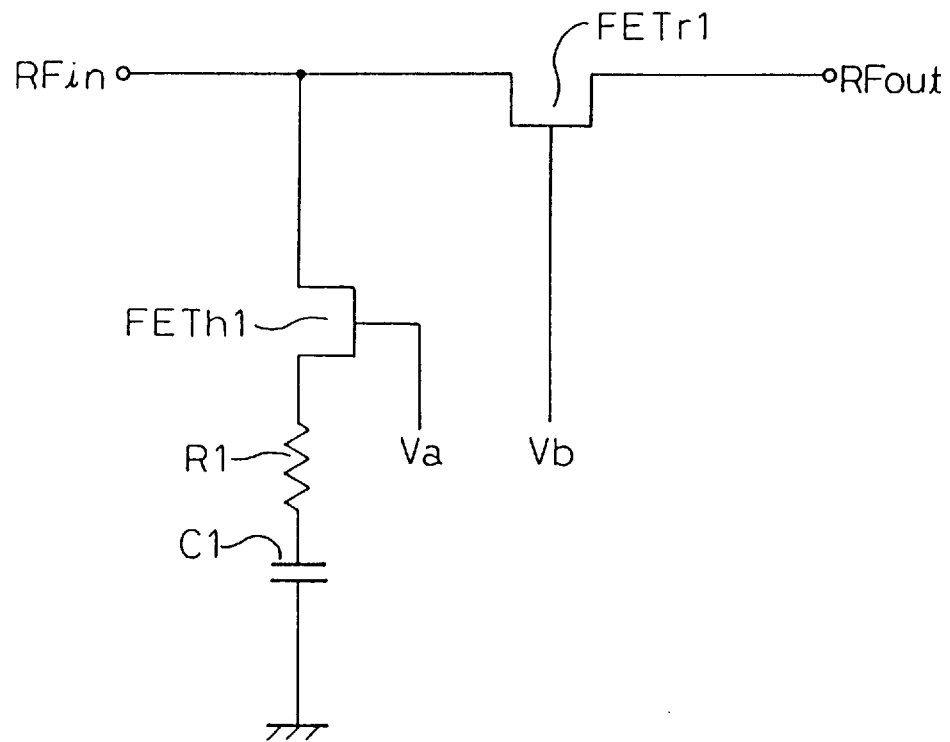
FIG. 1 is a diagram showing an example of a known circuit having a variable gain capability.
Figure 2:
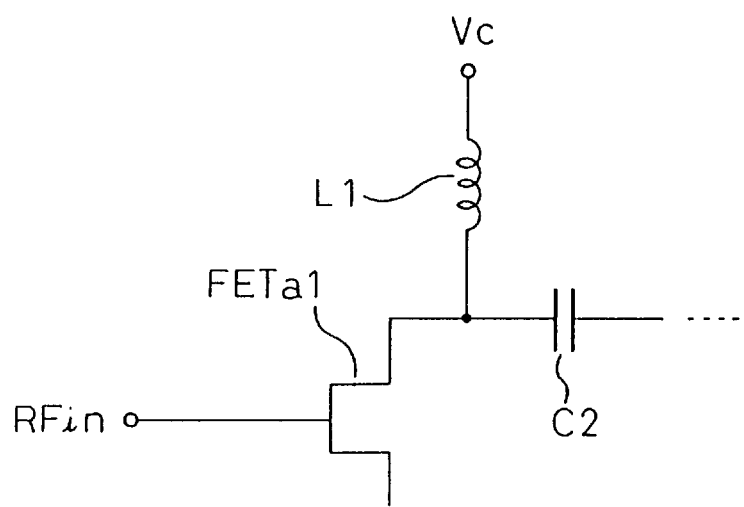
FIG. 2 is a diagram showing another example of a known circuit having a variable gain capability.
Figure 3:
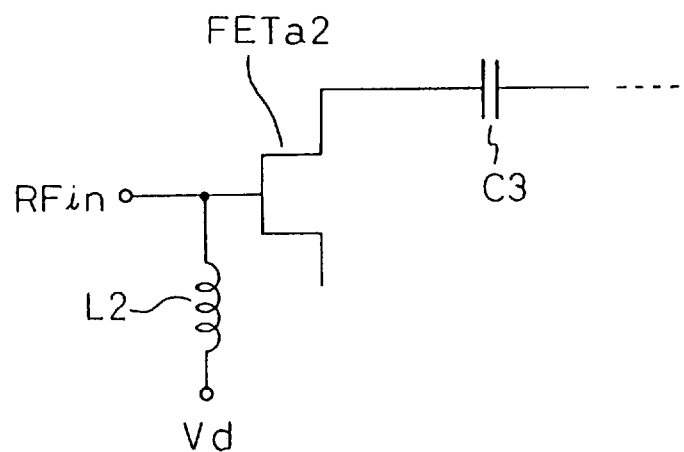
FIG. 3 is a diagram showing yet another example of a known circuit having a variable gain capability.

FIGS. 1 to 3 are diagrams showing examples of circuits conventionally used to realize a variable gain capability. FIG. 1 shows a circuit that is referred to as an attenuator type circuit and that can vary a quantity of attenuation, that is, a gain. The circuit is made by combining two field-effect transistors (FETs). As shown in FIG. 1, one FET FETr1 inputs an input signal RFin through one of the controlled electrodes thereof (drain), outputs an output signal through the other controlled electrode (source), and has a control signal Vb applied to a control electrode (gate) thereof. The other FET FETh1 has one (drain) of the controlled electrodes thereof connected to the drain of the FET FETr1, and therefore inputs the input signal RFin through the drain thereof. The FET FETh1 has the other controlled electrode (source) grounded via a capacitive element C1 and resistor R1, and inputs a control signal Va through a gate thereof.

The FET FETr1 conducts when the control signal Vb applied to the gate thereof is high, and outputs the input signal RFin as it is as an output signal RFout. When the level of the control signal Vb drops, the level of the output signal RFout decreases accordingly. When the control signal Vb is high, a quantity of attenuation decreases. The control signal Vb is low, the quantity of attenuation increases. When the control signal Vb is equal to or lower than a certain level, the quantity of attenuation becomes constant. If the variable range of the control signal Vb is set to a range permitting the output signal RFout to change linearly, the input signal RFin can be attenuated by controlling the control signal Vb.

In the circuit in which the series circuit made by connecting the FET FETh1, resistor R1, and capacitive element C1 in series is connected between the signal line for carrying the input signal RFin and a ground, when the FET FETh1 conducts, if the input signal RFin is a radio-frequency signal, an induced current partly flows to the ground. This causes the output signal RFout to be attenuated. Consequently, a quantity of attenuation of a signal increases as a quantity of the signal through the FETh1 increases according to an increase of the control signal Va applied to the gate of the FETh1. In the state in which the FET FETh1 conducts fully, the ratio of a fraction of current flowing to ground to the whole current is determined by the resistance of the resistor R1.

As mentioned above, attenuation caused by the FET FETr1 is independent of attenuation caused by the series circuit made up of the FET FETh1, resistor R1, and capacitive element C1. Only one circuit can realize the variable gain capability.

FIG. 2 shows a type of variable gain circuit that changes a quantity of attenuation, that is, a gain by varying the drain voltage of an FET FETa1 operating as an amplifier. A signal RFin to be amplified is applied to the gate of the FET FETa1. A control signal Vc is applied to the drain of the FET FETa1 via an inductive element L1. The source of the FET FETa1 is connected to a low-potential power supply such as a ground. An output signal is output through the drain of the FET FETa1 via a capacitive element C2. Since the control signal Vc is applied via the inductive element L1, the drain of the FET FETa1 is biased. Consequently, the amplification factor of the FET FETa1 is changed by varying the control signal Vc.

FIG. 3 shows a type of variable gain circuit that changes a gain by varying the gate voltage of an FET FETa2 operating as an amplifier. A signal RFin to be amplified is applied to the FET FETa2, and a control signal Vd is also applied to the FET FETa2 via an inductive element L2. An output signal is output through the drain of the FET FETa2 via a capacitive element C3. Voltage is applied between the drain of the FET FETa2 and the source thereof via an inductive element, though it is not illustrated. Since the control signal Vd is applied via the inductive element L2, the gate of the FET FETa2 is biased. Consequently, a gain produced by the FETa1, that is, a quantity of attenuation is changed by varying the control signal Vd.

An actual circuit is realized by connecting pluralities of circuits shown in FIGS. 1 to 3 in series or connecting other circuits in series.

The performance of a circuit with a variable gain capability is required to provide a large variable gain range, a small insertion loss, a good distortion characteristic, and easiness in using the capability of the circuit. In the case of the attenuator type circuit shown in FIG. 1, a quantity of attenuation depends greatly on the properties of transistors employed. If the circuit is designed to produce a large quantity of attenuation, the insertion loss of the circuit increases. In other words, the variable gain range and insertion loss have a trade-off relationship. This poses the problem that there is a difficulty in increasing the quantity of attenuation.

In the case of the circuit shown in FIG. 2, the control signal Vc for controlling the on or off state of the amplifier is generally output from an CMOS LSI needing a low current consumption. However, the driving ability of an output signal of the CMOS LSI is too small to input the control signal Vc directly to the drain of an FET. The method in which a switch having a large current capacity is inserted between a power supply and the drain of the FET, the switch is controlled using a control signal in order to change a quantity of attenuation must be adopted. This poses the problem that the circuit becomes complex.

Figure 4:
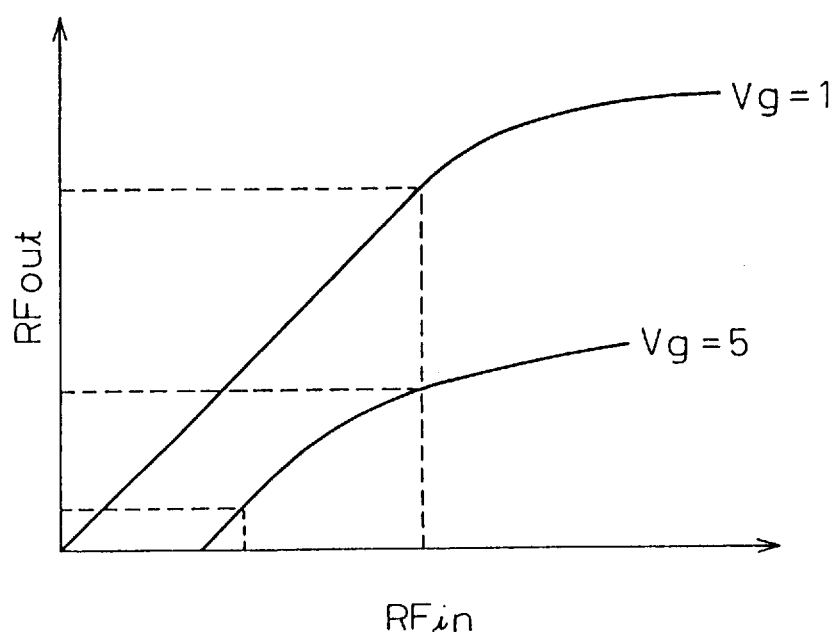
FIG. 4 is a diagram for explaining conditions under which the distortion characteristic of the known circuit shown in FIG. 3 deteriorates.

In the case of the circuit shown in FIG. 3, for increasing a quantity of attenuation, it is necessary to set a gate bias of an FET so that the operating point of the FET becomes as close to a pinch-off point thereof as possible. This poses the problem that the distortion characteristic of the circuit deteriorates. FIG. 4 shows the output characteristic of the circuit shown in FIG. 3. When a gain is 1 (when an input does not attenuate), an input RFin and output RFout have a linear relationship in a wide range. Within this range in which the relationship between the input and output is linear, attenuation distortion is small. In other words, attenuation distortion is small in a wide input range. By contrast, when an attenuation ratio is 5, the relationship between the input and output shows the illustrated characteristic and cannot retain linearity. Consequently, the attenuation distortion increases. When the quantity of attenuation is large, the distortion characteristic deteriorates with a large input RFin.

To solve the foregoing problems, a variable gain semiconductor circuit of the present invention, that is, a variable gain semiconductor circuit for changing the gain of an input signal on the basis of an attenuation value control signal, comprises a first kind of variable gain circuit that inputs an input signal and changes a gain on the basis of a first control signal; a second kind of variable gain circuit, installed in a stage succeeding the first kind of variable gain circuit, for changing a gain on the basis of a second control signal; and a control signal producing unit for producing the first and second control signals using the attenuation value control signal. The control signal producing unit produces the first and second control signals so that when the attenuation value control signal falls within one of two variation ranges instructing a large gain, the first kind of variable gain circuit decreases a gain according to the variation of the attenuation value control signal, and the second kind of variable gain circuit produces a constant gain. When the attenuation value control signal falls within the other variation range, the control signal producing unit produces the first and second control signals so that a decrease in gain produced by the first kind of variable gain circuit is saturated and the gain remains unchanged, and a gain produced by the second kind of variable gain circuit decreases according to the variation of the attenuation value control signal. More particularly, the first kind of variable gain circuit is an attenuation circuit shown in FIG. 1 having a first field-effect transistor that inputs an input signal through one controlled electrode thereof, outputs an output signal through the other controlled electrode thereof, and has a first control signal applied to a control electrode thereof, and a second field-effect transistor that inputs an input signal through one controlled electrode thereof, has the other controlled electrode thereof grounded via a resistive element, and has a reverse signal of the first control signal applied to a control electrode thereof. The second kind of variable gain circuit is the circuit shown in FIG. 3, and includes a third field-effect transistor that inputs an output of the first kind of variable gain circuit through a control electrode thereof, and has voltage applied between two controlled electrodes so that an output signal is output through either of the two controlled electrodes, a capacitive element having one terminal connected in an output stage of the third field-effect transistor and outputting an output signal through the other terminal thereof, and a gate bias means for applying a second control signal so that the potential at the control electrode of the third field-effect transistor is biased.

As mentioned above, the first kind of variable gain circuit shown in FIG. 1 has a problem in that there is a difficulty in increasing the quantity of attenuation because of the insertion loss thereof. The second kind of variable gain circuit shown in FIG. 3 has the problems that there is difficulty in increasing the quantity of attenuation because of the distortion characteristic, and that when an input signal has a large amplitude, the distortion characteristic deteriorates. The quantities of attenuation produced by these attenuators are not increased very much but the attenuators are combined to attain a large quantity of attenuation. In this case, the insertion loss will not increase. As for the distortion characteristic, deterioration of the distortion characteristic of the second kind of variable gain circuit poses a problem when the quantity of attenuation produced by the second kind of variable gain circuit is large and an input signal of the second kind of variable gain circuit has a large amplitude. After the first kind of variable gain circuit, which is installed in the preceding stage and whose distortion characteristic does not deteriorate, carries out attenuation, the second kind of variable gain circuit performs attenuation. A quantity of attenuation to be produced by the second kind of variable gain circuit is therefore small. The amplitude of the input signal becomes smaller when the signal is fed to the second kind of variable gain circuit. The deterioration of the distortion characteristic is therefore minimized.

Now, mention will be made of a difference of a mere combination of different kinds of variable gain circuits from a configuration such as the one of the present invention in which: when a quantity of attenuation is set to one of two variable ranges indicating a small quantity of attenuation, the first kind of variable gain circuit alone carries out attenuation; when the quantity of attenuation is set to the other variable range indicating a large quantity of attenuation, attenuation performed by the first kind of variable gain circuit ceases and the second kind of variable gain circuit alone carries out attenuation.

For example, Japanese Unexamined Patent Publication No. 62-235824 has disclosed a circuit in which the property of a pin diode that the resistance of the pin diode can be varied continuously with flowing current is utilized, a signal line is grounded via the pin diode in front of an amplifier, and the amplification factor of the amplifier is controlled by controlling the gate bias of an FET serving as the amplifier and also controlling the current flowing into the pin diode. This circuit can be said to be a combination of a first kind of variable gain circuit composed of the pin diode and a unit for controlling the current flowing into the pin diode, and a second kind of variable gain circuit formed with a variable amplifier. However, this circuit is different from that of the present invention in a point that the first kind of variable gain circuit and second kind of variable gain circuit operate within the whole variable range of a quantity of attenuation.

If a quantity of attenuation is small, the attenuation distortion is limited. The distortion characteristic is therefore hardly different between the known circuit and the circuit of the present invention. For a maximum quantity of attenuation, the first kind of variable gain circuit and the second kind of variable gain circuit in the known circuit produce respective maximum quantities of attenuation. Their distortion characteristics are therefore substantially the same. Since a required amount of attenuation can be assigned half-and-half to the two variable gain circuits, deterioration of the distortion characteristic of the whole circuit is reduced accordingly. However, the amplitude of an input signal to the second kind of variable gain circuit is moderately large and the distortion characteristics of the known circuit and the circuit of the present invention deteriorate to some extent.

For a medium quantity of attenuation, in the known circuit, two variable gain circuits in the first and second stages carry out attenuation. The quantity of attenuation produced by the first kind of variable gain circuit in the first stage is not a maximum quantity of attenuation. By contrast, in the circuit of the present invention, the first kind of variable gain circuit in the first stage carries out attenuation to its maximum quantity of attenuation. The amplitude of an input signal to the second kind of variable gain circuit in the second stage in the circuit of the present invention is therefore smaller than that in the known circuit. The distortion characteristic of the second kind of variable gain circuit in the second stage deteriorates when the amplitude of an input signal is large. Since the amplitude of an input signal to the second kind of variable gain circuit in the second stage in the circuit of the present invention is smaller. The deterioration of the distortion characteristic of the circuit of the present invention is therefore more minimized.

Figure 5:
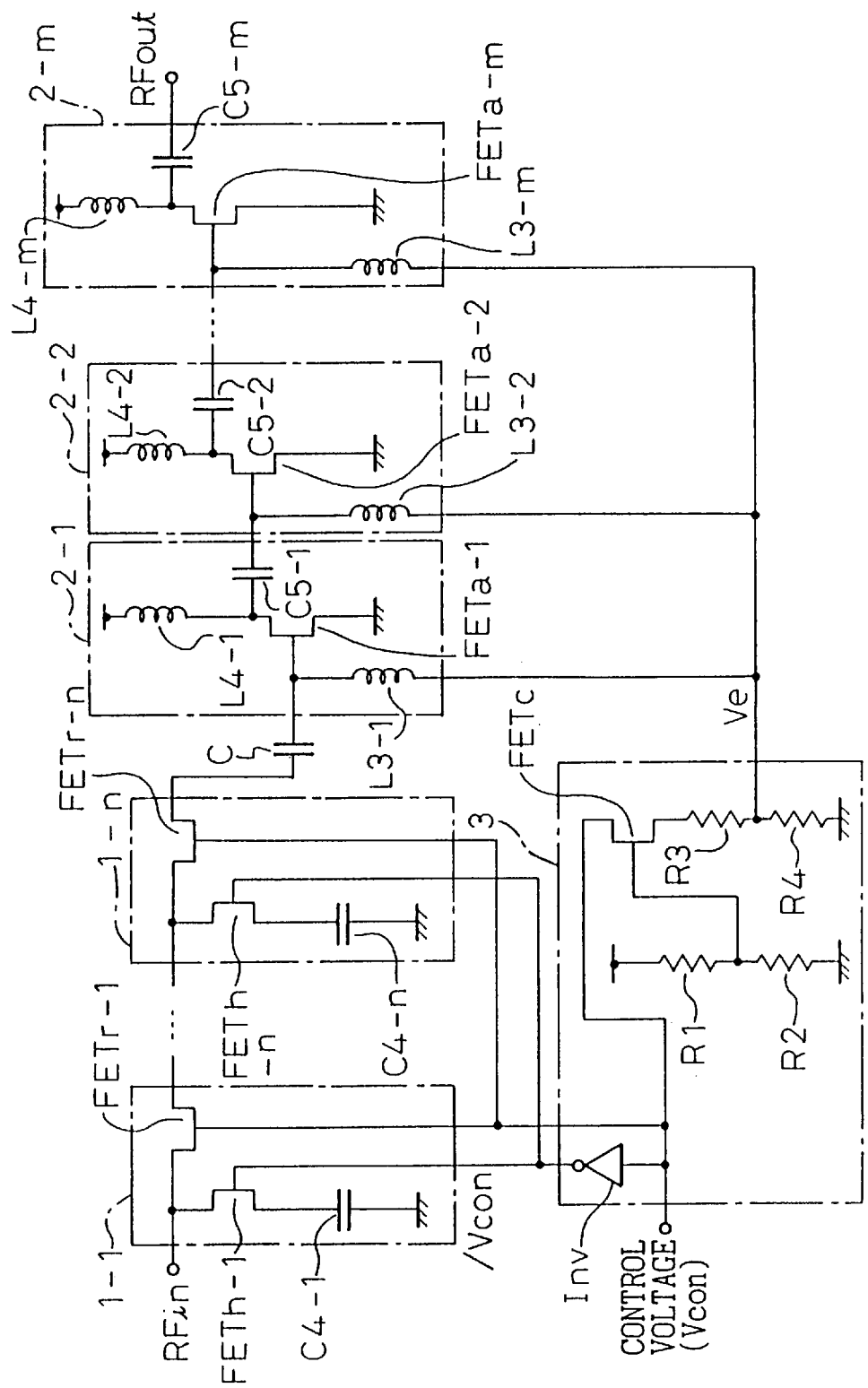
FIG. 5 is a diagram showing the circuitry of a variable gain semiconductor circuit of an embodiment of the present invention.

FIG. 5 is a diagram showing the circuitry of a variable gain semiconductor circuit of an embodiment of the present invention.

As shown in FIG. 5, this circuit comprises a first stage composed of circuits 1-1, 1-2, etc., and 1-n that are n attenuators like the one shown in FIG. 1 connected in series, a second stage composed of circuits 2-1, 2-2, etc., and 2-m that are m amplifiers like the one shown in FIG. 3 having gate biases thereof controlled, and a control unit 3 for supplying a control signal to each of the circuits in the first and second stages. A control voltage Vcon is applied to the gates of FETs FETr-1, FETr-2, etc., and FETr- n in the first stage. A signal/ Vcon made by reversing the control voltage Vcon using an inverter Inv is applied to the gates of FETs FETh-1, FETh-2, etc., and FETh-n. The operations of each attenuator in the first stage have been described with reference to FIG. 1. The description of the operations will be omitted.

In the amplifiers 2-1, 2-2, etc., and 2-m in the second stage, the drains of FETs FETa-1, FETa-2, etc., and FETa-m are connected to a high-potential power supply via inductive elements L4-1, L4-2, etc., and L4-m, and the sources thereof are grounded. A control signal Ve is applied to the gates of the FETs FETa-1, FETa-2, etc., and FETa-m via inductive elements L3-1, L3-2, etc., and L3-m.

The control unit 3 consists of a first section for producing a signal used to control the attenuators in the first stage, and a second section for producing a signal used to control the amplifiers in the second stage. The first section includes the inverter Inv for producing the voltage /Vcon by reversing the control voltage Vcon. The second section includes an FET FETc that has the control voltage Vcon applied to the drain thereof, a resistive divider circuit composed of resistors R1 and R2 for producing a gate voltage of the FET FETc, and a resistive divider circuit connected between the source of the FET FETc and the ground and composed of resistors R3 and R4 for producing the control signal Ve to be applied to the second stage.

Figure 6:
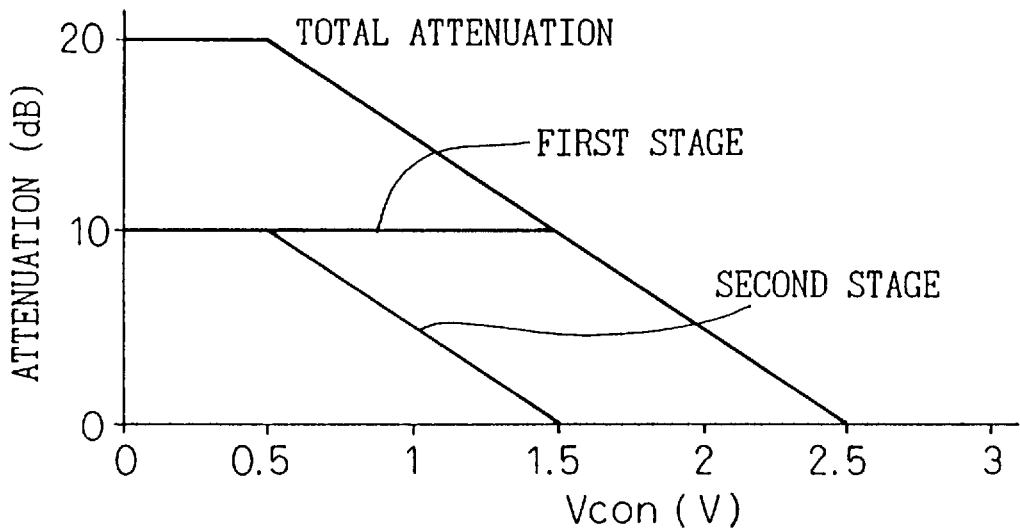
FIG. 6 is a diagram showing the attenuation characteristics of the first stage, second stage, and the entire variable gain semiconductor circuit of the embodiment.
Figure 7:
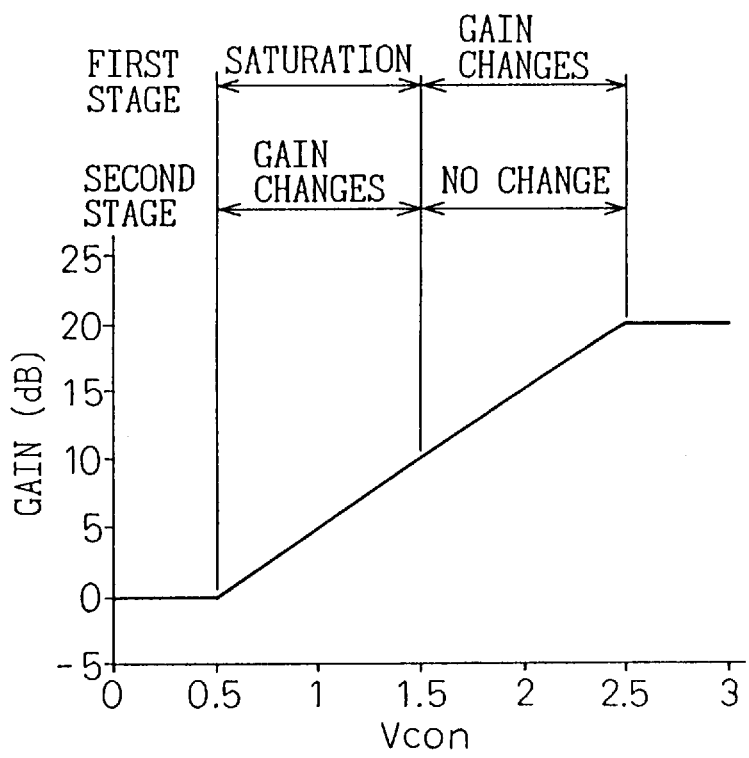
FIG. 7 is a diagram showing a change in gain produced by an amplifier to which the variable gain semiconductor circuit of the embodiment is adapted.

FIG. 6 is a diagram showing the attenuation characteristics of the first stage, second stage, and the whole of the variable gain semiconductor circuit of the embodiment. FIG. 7 is a diagram showing a change in gain produced by an amplifier formed with the variable gain semiconductor attenuator in the embodiment. Referring to FIGS. 6 and 7, the operations of the circuit shown in FIG. 5 will be described.

The control voltage Vcon is variable from 0 V to 3 V. With the variation of the control voltage Vcon in the range from 0.5 V to 2.5 V, a gain changes. When the control voltage Vcon is 1.5 V or higher, the FET FETc is operational and the source voltage of the FET FETc is approximately 0.6 V. The control signal Ve has a value obtained by dividing 0.6 V by the number of resistors R3 and R4, that is, 0.3 V. When the control voltage Vcon is 1.5 V or higher, the gates of the FETs FETa-1, FETa-2, etc., and FETa-m in the second stage are biased with 0.3 V. In this state, the amplifiers 2-1, 2-2, etc., and 2-m carry out amplification of a given high level. Consequently, attenuation is not carried out.

The control voltage Vcon is applied to the gates of the FETs FETr-1, FETr-2, etc., and FETr-n in the first stage, and the reverse signal /Vcon is applied to the gates of the FETs FETh-1, FETh-2, etc., and FETh-n. As described with reference to FIG. 1, when the control voltage Vcon is high, that is, when the reverse signal /Vcon is low, the FETs FETr-1, FETr-2, etc., and FETr-n are fully conducting, while the FETs FETh-1, FETh-2, etc., and FETh-n are nonconducting. The attenuators do not therefore attenuate a signal. When the control voltage Vcon is 2.5 V or higher, the attenuation range is zero and a maximum gain is produced. As the control voltage Vcon drops gradually, a quantity of attenuation attained by the FETs FETr-1, FETr-2, etc., and FETr-n increases gradually. The FETs FETh-1, FETh-2, etc., and FETh-n conduct one after another. Since current flowing through these FETs to the ground increases, the gain decreases. When the control voltage Vcon becomes 1.5 V, the quantity of attenuation attained by the attenuators in the first stage becomes maximum. Thereafter, even if the control voltage Vcon drops, the quantity of attenuation remains constant. When the control voltage Vcon becomes 1.5 V or lower, the source voltage of the FET FETc drops along with the drop of the control voltage Vcon. The control signal Ve starts dropping. This causes the gate biases of the FETs FETa-1, FETa-2, etc., and FETa-m in the second stage to drop gradually. A quantity of amplification attained by the amplifiers in the second stage decreases gradually. When the control voltage Vcon reaches 0.5 V, the control signal Ve becomes 0 V. The quantity of amplification attained by the amplifiers in the second stage become constant.

The whole circuit shows the attenuation characteristic shown in FIG. 6.

As described so far, according to the present invention, a variable gain semiconductor attenuator enjoying a low insertion loss, a good distortion characteristic, and a large variable gain range can be realized.

What is claimed is:

1. A variable gain semiconductor circuit for changing the gain of an input signal on the basis of an attenuation value control signal, comprising:

a first kind of variable gain circuit that inputs said input signal and changes the gain on the basis of a first control signal;

a second kind of variable gain circuit, installed in a stage succeeding said first kind of variable gain circuit, for changing the gain on the basis of a second control signal; and a control signal producing unit for producing said first and second control signals using said attenuation value control signal, wherein, when said attenuation value control signal falls within one of two variation ranges instructing a large gain, said control signal producing unit produces said first and second control signals so that said first kind of variable gain circuit decreases a gain according to the variation of said attenuation value control signal, and said second kind of variable gain circuit produces a constant gain; and when said attenuation value control signal falls within the other variation range instructing a small gain, said control signal producing unit produces said first and second control signals so that a decrease in gain produced by said first kind of variable gain circuit is saturated and the gain remains unchanged, and a gain produced by said second kind of variable gain circuit decreases according to the variation of said attenuation value control signal.

2. A variable gain semiconductor circuit according to claim 1, wherein said first kind of variable gain circuit includes:

a first field-effect transistor that inputs said input signal through one controlled electrode thereof, outputs an output signal through the other controlled electrode thereof, and has said first control signal applied to a control electrode thereof; and a second field-effect transistor that inputs said input signal through one controlled electrode thereof, has the other controlled electrode thereof grounded via a resistive element, and has a reverse signal of said first control signal applied to a control electrode thereof, and said second kind of variable gain circuit includes:

a third field-effect transistor that inputs an output of said first kind of variable gain circuit through a control electrode thereof, and has voltage applied between two controlled electrodes thereof so that an output signal is output through either of the two controlled electrodes;

a capacitive element having one terminal thereof connected in an output stage of said third field-effect transistor and outputting an output signal through the other terminal thereof; and a gate bias means for applying said second control signal so that the potential at said control electrode of said third field-effect transistor is biased.

* * * * *